(12) United States Patent
Chen

(10) Patent No.: US 8,334,717 B2
(45) Date of Patent: Dec. 18, 2012

(54) DYNAMIC COMPARATOR BASED COMPARISON SYSTEM

(75) Inventor: Bo-Wei Chen, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 152 days.

(21) Appl. No.: 12/981,516

(22) Filed: Dec. 30, 2010

(65) Prior Publication Data

US 2012/0119790 A1   May 17, 2012

(30) Foreign Application Priority Data

Nov. 17, 2010   (TW) .............................. 99139552 A

(51) Int. Cl.
 *H03L 5/00* (2006.01)
(52) U.S. Cl. .............. 327/307; 327/50; 327/63; 327/67; 327/306
(58) Field of Classification Search .................... 327/52, 327/53, 58, 60, 62, 63, 65–69, 71, 72, 74, 327/77–81, 88, 89, 96, 127, 246, 266, 274, 327/280, 287, 306–333, 359, 560–563
See application file for complete search history.

(56) References Cited

U.S. PATENT DOCUMENTS

| | | | | |
|---|---|---|---|---|
| 6,320,426 | B1 * | 11/2001 | Shih ................................ | 327/65 |
| 6,822,501 | B2 * | 11/2004 | Kinugasa ...................... | 327/307 |
| 7,389,097 | B2 * | 6/2008 | Tamura ......................... | 455/280 |
| 7,405,682 | B2 * | 7/2008 | Ebner et al. .................... | 341/120 |
| 7,728,632 | B1 * | 6/2010 | Bi .................................. | 327/65 |
| 2009/0115523 | A1 * | 5/2009 | Akizuki et al. ............... | 330/260 |

OTHER PUBLICATIONS

Chun-Ying Chen et al, "A Low Power 6-bit Flash ADC with Reference Voltage and Common-Mode Calibration", 2008 Symposium on VLSI Circuits Digest of Technical Papers, issued on 2008, p. 12-p. 13.
Yuan-Ching Lien et al "A 6-b 1-GS/s 30-mW ADC in 90-NM CMOS Technology", IEEE Asian Solid-State Circuits Conference, issued on Nov. 3-5, 2008 in Fukuoka Japan, p. 45-p. 48.
Hiroyuki Okada et al, "Offset Calibrating Comparator Array for 1.2-V, 6-bit, 4-Gsamplels Flash ADCs using 0.13-um generic CMOS technology", issued on 2003 in Japan. p. 711-p. 714.
Pedro M. Figueiredo et al, "A 90nm CMOS 1.2V 6b 1GS/s Two-Step Subranging ADC", 2006 IEEE International Solid-State Circuits Conference, issued on Feb. 8, 2006, p. 1-p. 10.

* cited by examiner

*Primary Examiner* — Lincoln Donovan
*Assistant Examiner* — Brandon S Cole
(74) *Attorney, Agent, or Firm* — Jianq Chyun IP Office

(57) ABSTRACT

A comparison system including a dynamic comparator, a background offset calibration circuit, and an asynchronous reset timing control circuit is presented. The background offset calibration circuit is coupled to the dynamic comparator, and generates calibration signals in response to reference switching control signals. Where calibration signals are used to calibrate the input refer offset of the dynamic comparator. The asynchronous reset timing control circuit is coupled to the dynamic comparator and the background offset calibration circuit, and generates a control clock signal and the reference switching control signals in response to the output signals of the dynamic comparator and a plurality of basic clock signals. During each clock cycle of the first basic clock signal, the control clock signal is used to control the dynamic comparator to perform two data comparison, one for the input refer offset and the other for a differential input signal.

17 Claims, 17 Drawing Sheets

DYNAMIC COMPARATOR BASED COMPARISON SYSTEM

CROSS-REFERENCE TO RELATED APPLICATION

This application claims the priority benefit of Taiwan application serial no. 99139552, filed on Nov. 17, 2010. The entirety of the above-mentioned patent application is hereby incorporated by reference herein and made a part of this specification.

TECHNICAL FIELD

The disclosure relates to a comparison system, and particularly to a dynamic comparator based comparison system.

BACKGROUND

Comparator based analog-to-digital converters (ADCs), for example, ADCs with structures of successive approximation register (SAR), flash, folding and sub-ranging are always very popular research issues, and a feature thereof is that none operational amplifier (OPAMP) is used, so that a fabrication process thereof could be highly integrated, especially in application of a deep-submicron fabrication technique (<0.13 um).

And, comparators in many high-speed (>GSample/second, GS/s) ADCs generally apply a dynamic structure, so that none static current is consumed. Moreover, the comparator based ADC also has an advantage of greatly reducing power consumption of the ADC. Therefore, in recent years, the OPAMP based pipelined ADCs are developed towards a trend of the comparator based ADCs. It could be known that the comparator based ADCs gradually become one of technical focuses in research and development of related field of the disclosure, so that it is an important issue to be developed in the related field of the disclosure to achieve advantages of high-speed (>GS/s), low power consumption (milliwatt scale) and medium/high resolution ($\geqq 8$ bits) of the comparator based ADCs.

Regarding the high-speed and low power consumption comparator, many related structures are disclosed, in which the most representative one is disclosed in a journal article of IEEE JSSC 1993 authored by Kobayashi et al. entitled "A current controlled latch sense amplifier and a static power-saving input buffer for low-power architecture". Moreover, regarding the medium/high resolution comparator, a representative paper thereof is disclosed in a journal article of IEEE JSSC, 1992 authored by Razavi et al. entitled "Design techniques for high-speed, high-resolution comparators".

According to studies after 2000, when a sampling frequency of the comparator based ADC is limited to be above GS/s, a dynamic comparator provided by Kobayashi et al. can meet the requirements of high-speed and low power consumption, so that it becomes a most popular comparator structure. However, regarding the comparator structure simultaneously satisfying the requirements of medium/high resolution, high-speed and low power consumption, there is still no comparator suitable for GS/s applications in related document.

Regarding a background offset calibration technique applied for the dynamic comparator, that could be used to improve the accuracy of comparator to achieve the requirements of medium/high resolution of the comparator based ADCs. A popular structure is to apply two independent comparators in collaboration with a same control clock signal is generally used. Moreover, during a disable phase of a previous clock cycle of the control clock signal, the two comparators are all reset, and during an enable phase of the previous clock cycle, one of the comparators performs the comparison of the input refer offset, and another comparator performs the comparison of a differential input signal. Thereafter, during a disable phase of a current clock cycle of the control clock signal, the two comparators are still reset, though during an enable phase of the current clock cycle, the comparator previously used for performing the comparison of the input refer offset is now used for performing the comparison of the differential input signal, while the comparator previously used for performing the comparison of the differential input signal is now used for performing the comparison of the input refer offset. In other words, the conventional control clock signal is used to control operations of the two independent comparators in a time-interleaved approach, so as to implement a background offset calibration mechanism of the dynamic comparator.

SUMMARY

The disclosure is directed to a comparison system including a (single) dynamic comparator, a background offset calibration circuit, and an asynchronous reset timing control circuit. The background offset calibration circuit is coupled to the dynamic comparator, and generates calibration signals to the dynamic comparator in response to reference switching control signals, so as to calibrate the input refer offset of the dynamic comparator. The asynchronous reset timing control circuit is coupled to the dynamic comparator and the background offset calibration circuit, and generates a control clock signal and the reference switching control signals in response to an output of the dynamic comparator and a plurality of basic clock signals, and the control clock signal is used to control the dynamic comparator to perform a comparison of the input refer offset and a comparison of a differential input signal during each clock cycle of a first basic clock signal of the basic clock signals.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Figure 1:
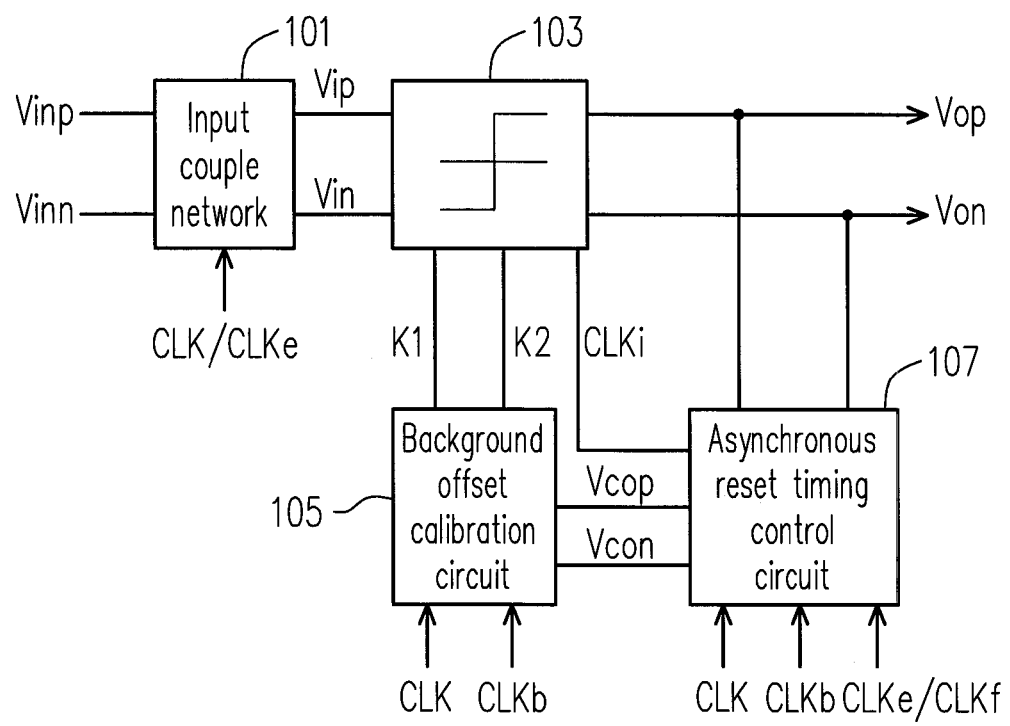
FIG. 1 is a schematic diagram illustrating a comparison system 10 according to an exemplary embodiment of the disclosure.

Reference will now be made in detail to the present exemplary embodiments of the disclosure, examples of which are illustrated in the accompanying drawings. Wherever possible, the same reference numbers are used in the drawings and the description to refer to the same or like parts.

It should be noticed that in the disclosure, a control clock signal used for controlling a dynamic comparator is suitably designed through a simple logic circuit, so that the single dynamic comparator can perform two signal comparison operations during each clock cycle of a first basic clock signal, where one is to perform the comparison of the offset of the dynamic comparator itself (i.e. the input refer offset), and another one is to perform the comparison of a differential input signal of the dynamic comparator. In this way, the single dynamic comparator can simultaneously complete a background offset calibration of the dynamic comparator and a comparison operation of the differential input signal during each clock cycle of the first basic clock signal. Therefore, a usage amount of the dynamic comparators could be reduced to half, so that not only an area usage rate of the application of chip could be improved, but also system power consumption could be reduced.

Accordingly, FIG. 1 is a schematic diagram illustrating a comparison system 10 according to an exemplary embodiment of the disclosure. Referring to FIG. 1, the comparison system 10 includes an input couple network 101, a dynamic comparator 103, a background offset calibration circuit 105, and an asynchronous reset timing control circuit 107. The input couple network 101 is coupled to the dynamic comparator 103, and provides a common mode voltage Vcm or a differential input signal, named Vip and Vin respectively, to the dynamic comparator 103 in response to a first or a second basic clock signal, i.e. CLK or CLKe.

Figure 2A:
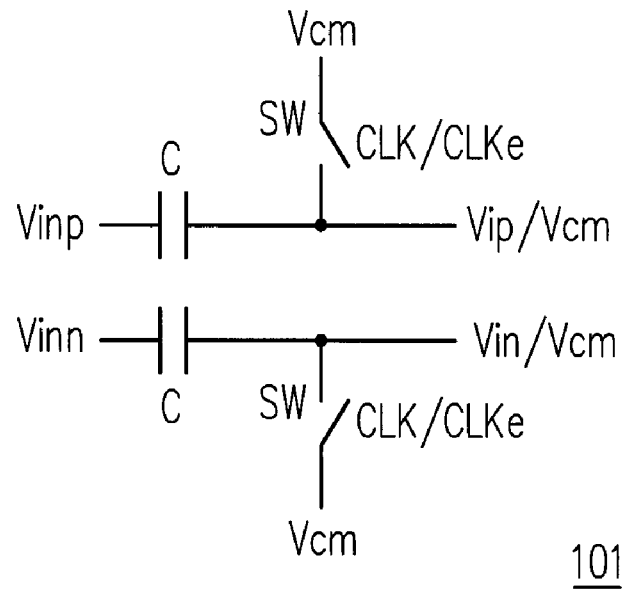
FIG. 2A is a schematic diagram of an input AC couple network 101 according to an exemplary embodiment of the disclosure.

In the present exemplary embodiment, the input couple network 101 could be an input alternating current (AC) couple network or an input direct current (DC) couple network. In detail, FIG. 2A is a schematic diagram of the input AC couple network 101 according to an exemplary embodiment of the disclosure. Referring to FIG. 2A, the input AC couple network 101 includes two capacitors C and two switches SW. First ends of the two capacitors C receive differential signals Vinp and Vinn relating to the alternating current, and second ends of the two capacitors C provide the common mode voltage Vcm or the differential input signal Vip and Vin in response to the first or the second basic clock signal (i.e. CLK or CLKe).

First ends of the two switches SW are respectively coupled to the second ends of the two capacitors C, second ends of the two switches SW receive the common mode voltage Vcm, and control ends of the two switches SW receive the first or the second basic clock signal (i.e. CLK or CLKe). In this way, when the input AC couple network 101 receive the differential signals Vinp and Vinn, the input AC couple network 101 may provide the common mode voltage Vcm (i.e. Vip=Vin=Vcm) to the dynamic comparator 103 in response to enabling of the first or the second basic clock signal (i.e. CLK or CLKe). On the other hand, when the input AC couple network 101 receive the differential signals Vinp and Vinn, the input AC couple network 101 may provide the differential input signal Vip and Vin (i.e. the differential signals Vinp and Vinn without containing a DC component) to the dynamic comparator 103 in response to disabling of the first or the second basic clock signal (i.e. CLK or CLKe).

Figure 2B:
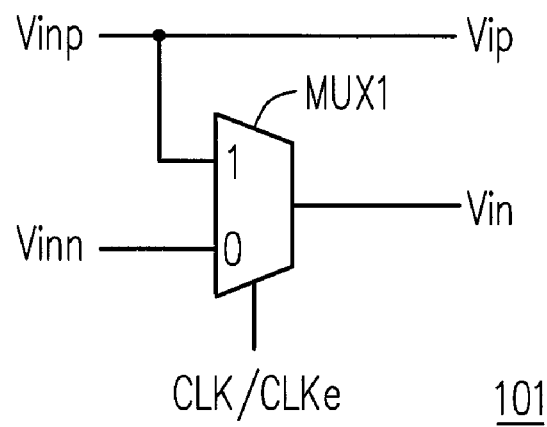
FIG. 2B is a schematic diagram of an input DC couple network 101 according to an exemplary embodiment of the disclosure.

Moreover, FIG. 2B is a schematic diagram of the input DC couple network 101 according to an exemplary embodiment of the disclosure. Referring to FIG. 2B, the input DC couple network 101 includes a multiplexer MUX1. Two input terminals (1, 0) of the multiplexer MUX1 receive the differential signals Vinp and Vinn relating to the direct current, an output terminal of the multiplexer MUX1 provides a DC voltage Vinp or Vinn in response to the first or the second basic clock signal (i.e. CLK or CLKe), and a select terminal of the multiplexer MUX1 receives the first or the second basic clock signal (i.e. CLK or CLKe). In this way, the input DC couple network 101 may provide a same input voltage Vinp (i.e. Vip=Vin=Vinp) to the dynamic comparator 103 in response to enabling of the first or the second basic clock signal (i.e. CLK or CLKe). On the other hand, the input DC couple network 101 may provide the differential input signal Vip and Vin (i.e. the differential signals Vinp and Vinn relating to the direct current) to the dynamic comparator 103 in response to disabling of the first or the second basic clock signal (i.e. CLK or CLKe).

Referring to FIG. 1, the background offset calibration circuit 105 is coupled to the dynamic comparator 103, and generates two calibration signals K1 and K2 to the dynamic comparator 103 in response to two reference switching control signals Vcop and Vcon generated by the asynchronous reset timing control circuit 107, so as to calibrate the input refer offset of the dynamic comparator 103 generated due to process mismatch.

In the present exemplary embodiment, the background offset calibration circuit 105 can use a voltage mode to perform a background offset calibration for the dynamic comparator 103. Therefore, the two calibration signals K1 and K2 generated by the background offset calibration circuit 105 are two calibration voltages. In this case, circuit structures of the dynamic comparator 103 are as that shown in FIG. 3A and FIG. 3B, and circuit structures of the background offset calibration circuit 105 are as that shown in FIG. 4A and FIG. 4B.

Figure 3A:
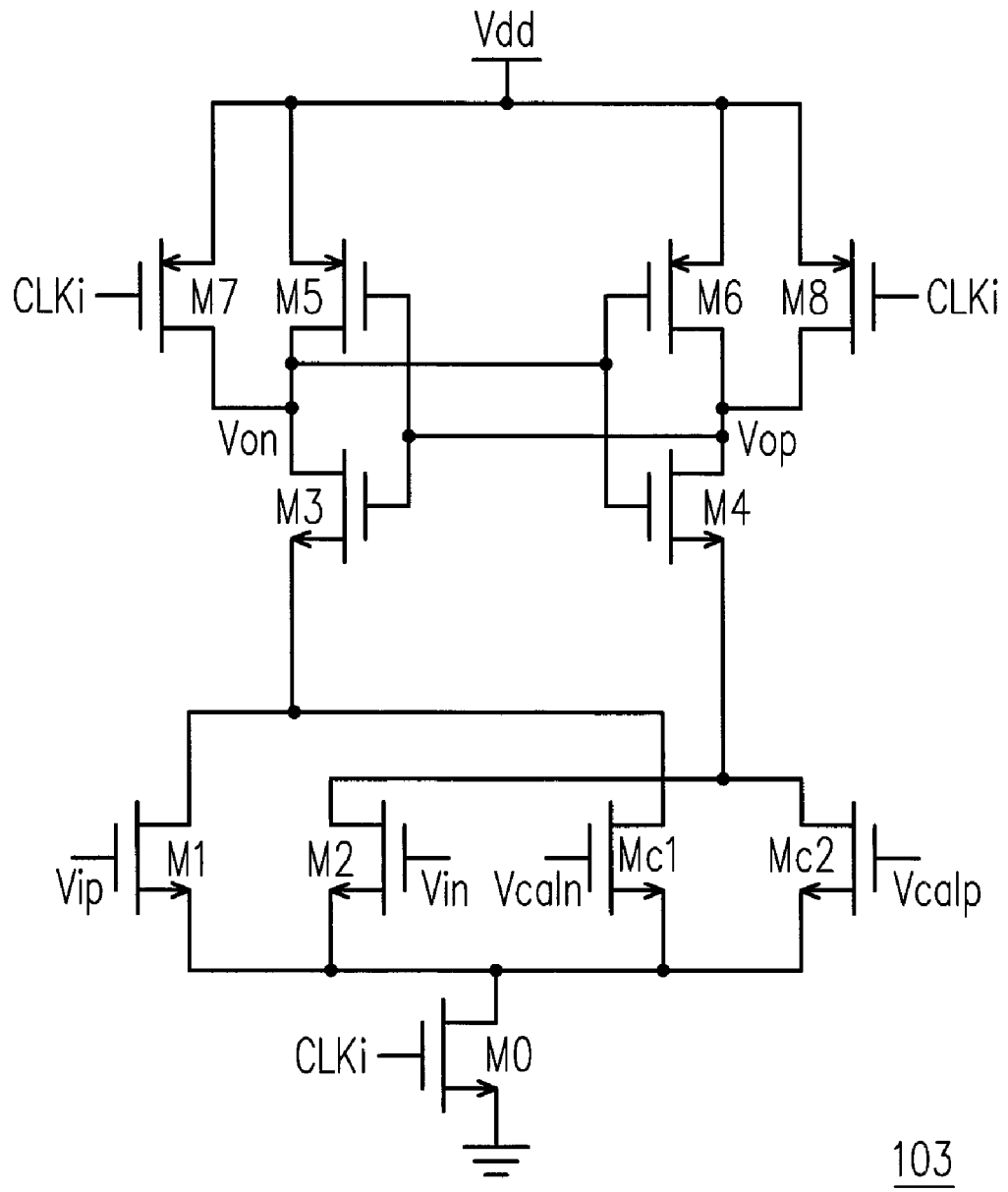
FIGS. 3A-3B, FIGS. 5A-5C and FIGS. 7A-7C are schematic diagrams respectively illustrating a dynamic comparator 103 according to an exemplary embodiment of the disclosure.
Figure 3B:
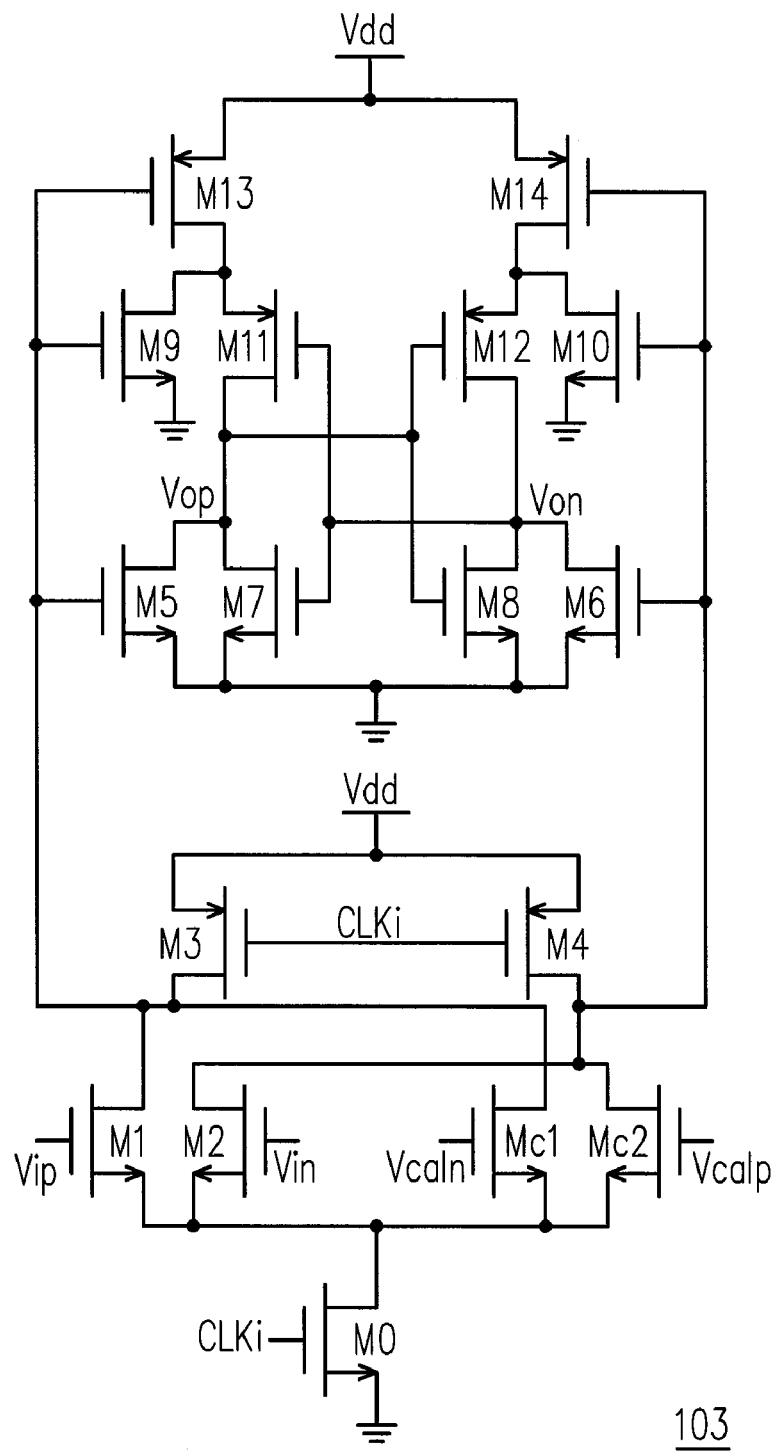

In FIG. 3A, the dynamic comparator 103 includes N-type transistors M0-M4, Mc1 and Mc2, and P-type transistors M5-M8. Moreover, in FIG. 3B, the dynamic comparator 103 includes N-type transistors M0-M2, Mc1, Mc2, M5-M8, M9 and M10, and P-type transistors M3, M4 and M11-M14. Gates of the N-type transistors M1 and M2 receive the differential input signal Vip and Vin from the input couple network 101, and gates of the N-type transistors Mc1 and Mc2 receive two calibration voltages Vcalp and Vcaln from the background offset calibration circuit 105. Basically, both of the dynamic comparators 103 of FIG. 3A and FIG. 3B operate in response to a control clock signal CLKi generated by the asynchronous reset timing control circuit 107.

Figure 4A:
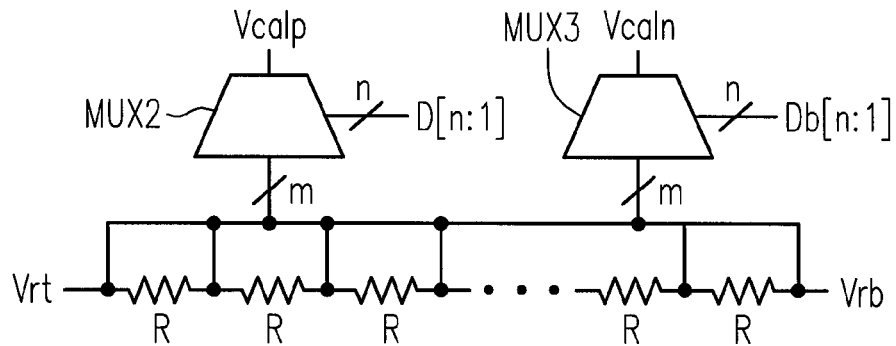
FIGS. 4A-4B, FIG. 6 and FIG. 8 are schematic diagrams respectively illustrating a background offset calibration circuit 105 according to an exemplary embodiment of the disclosure.
Figure 4A:
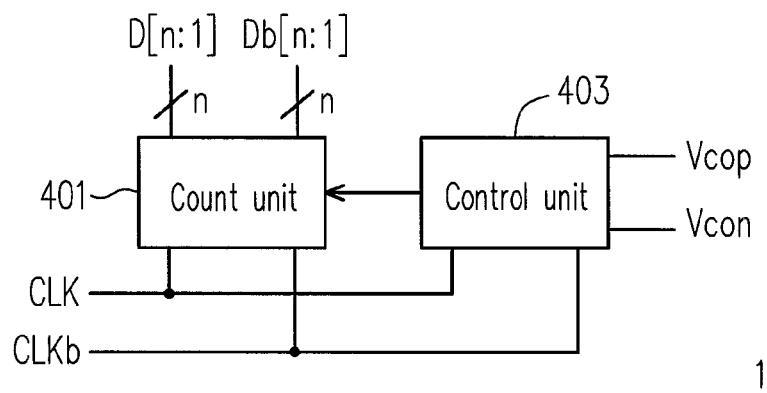

Moreover, in FIG. 4A, the background offset calibration circuit 105 includes a count unit 401, a control unit 403, a plurality of resistors R connected in series between two reference voltages Vrt and Vrb, and two multiplexers MUX2 and MUX3. The control unit 403 controls the operation of the count unit 401 in response to the two reference switching control signals Vcop and Vcon generated by the asynchronous reset timing control circuit 107 and the first and a third basic clock signal (i.e. CLK and CLKb), so that the count unit 401 provides two set of digital control signals D[n:1] and Db[n:1]. In this way, the multiplexers MUX2 and MUX3 may select to output one of m received voltage-dividing signals in response to the two set of digital control signals D[n:1] and Db[n:1], so as to generate the two calibration voltages Vcalp and Vcaln to the dynamic comparator 103.

Figure 4B:
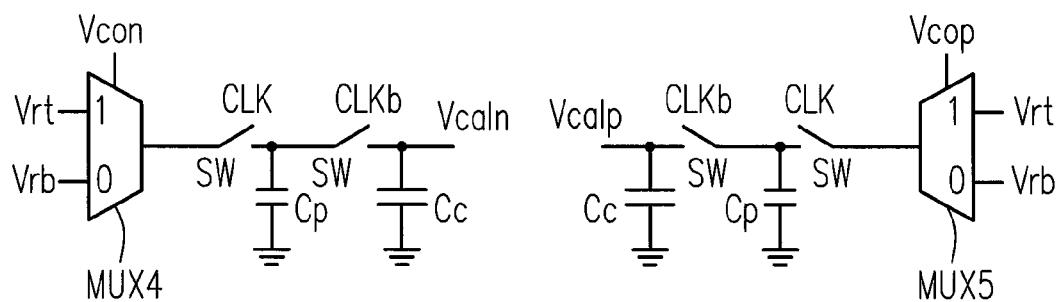

Moreover, in FIG. 4B, the background offset calibration circuit 105 includes two multiplexers MUX4 and MUX5, a plurality of switches SW, and a plurality of capacitors Cp and Cc, where a ratio of the capacitors Cp and Cc determines an accuracy of the offset calibration. And, a portion of the switches SW is controlled by the first basic clock signal CLK, and another portion of the switches SW is controlled by the third basic clock signal CLKb. In this way, the multiplexers MUX4 and MUX5 can select and output one of the two received reference voltages Vrt and Vrb in response to the two reference switching control signals Vcop and Vcon generated by the asynchronous reset timing control circuit 107, respectively, and generate the two calibration voltages Vcalp and Vcaln to the dynamic comparator 103 in collaboration with operations of the switches SW and the capacitors Cp and Cc respectively.

On the other hand, the background offset calibration circuit 105 can use a current mode to perform the background offset calibration to the dynamic comparator 103. Therefore, the two calibration signals K1 and K2 generated by the background offset calibration circuit 105 are two calibration currents. In this case, the circuit structures of the dynamic comparator 103 are as that shown in FIG. 5A-FIG. 5C, and the circuit structure of the background offset calibration circuit 105 is as that shown in FIG. 6.

Figure 5A:
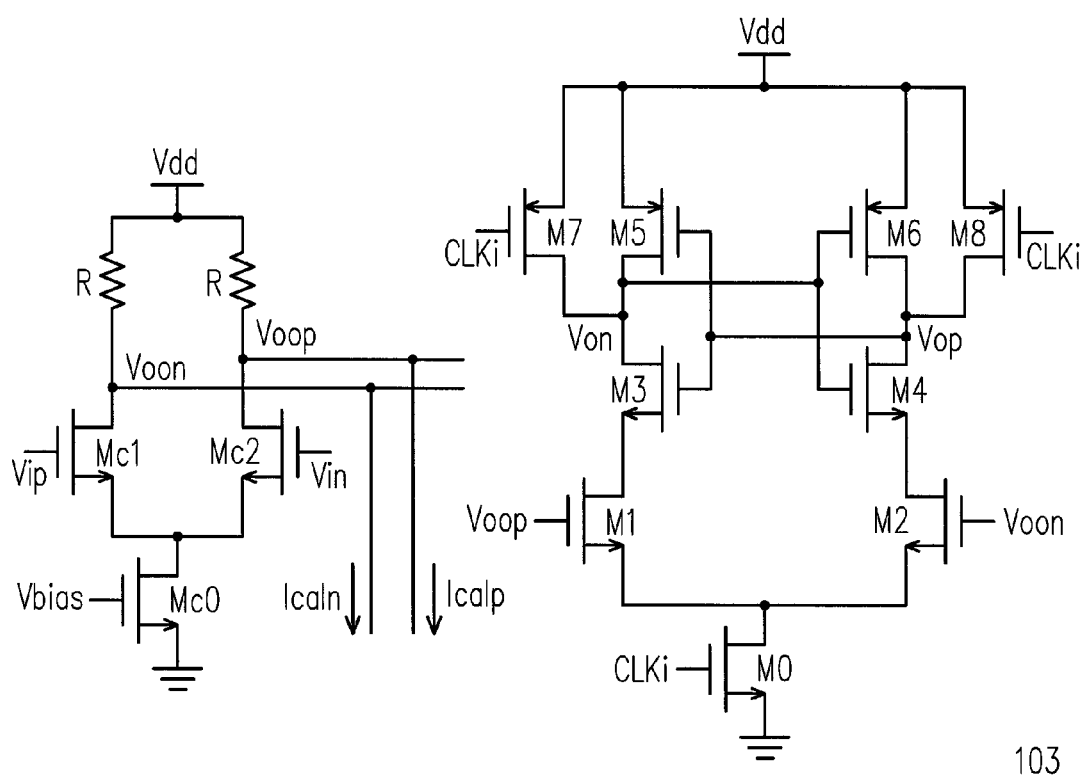
Figure 5B:
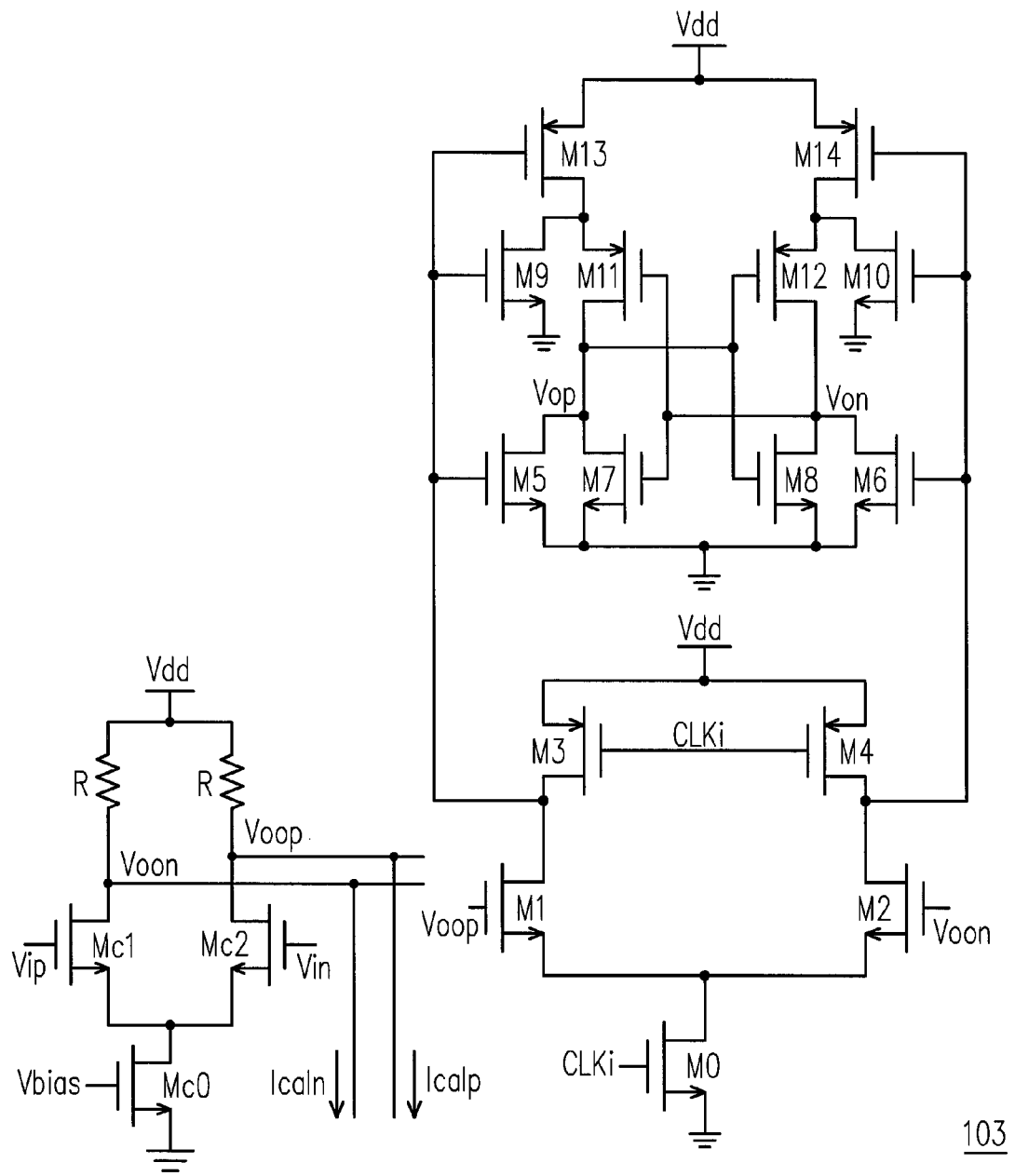
Figure 5C:
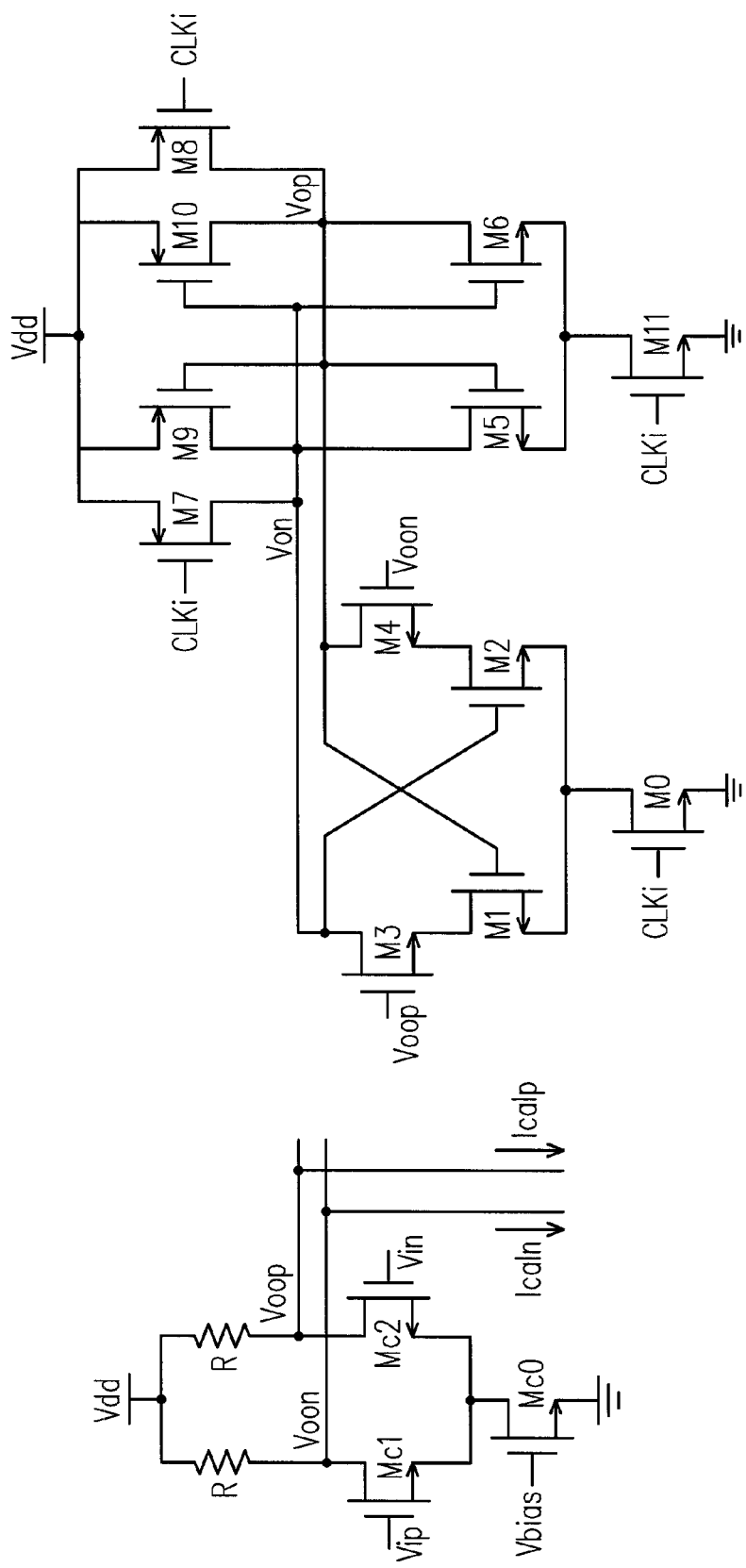

In FIG. 5A, the dynamic comparator 103 includes N-type transistors M0-M4 and Mc0-Mc2, P-type transistors M5-M8, and two resistors R. Moreover, in FIG. 5B, the dynamic comparator 103 includes N-type transistors M0-M2, Mc0-Mc2, M5-M8, M9 and M10, P-type transistors M3, M4 and M11-M14, and two resistors R. Furthermore, in FIG. 5C, the dynamic comparator 103 includes N-type transistors M0-M6, M11 and Mc0-Mc2, P-type transistors M7-M10, and two resistors R. Gates of the N-type transistors Mc1 and Mc2 receive the differential input signal Vip and Vin from the input couple network 101, and drains of the N-type transistors Mc1 and Mc2 receive two calibration currents Icalp and Icaln from the background offset calibration circuit 105. Basically, the dynamic comparators 103 of FIG. 5A-FIG. 5C operate in response to a bias Vbias and the control clock signal CLKi generated by the asynchronous reset timing control circuit 107.

Figure 6:
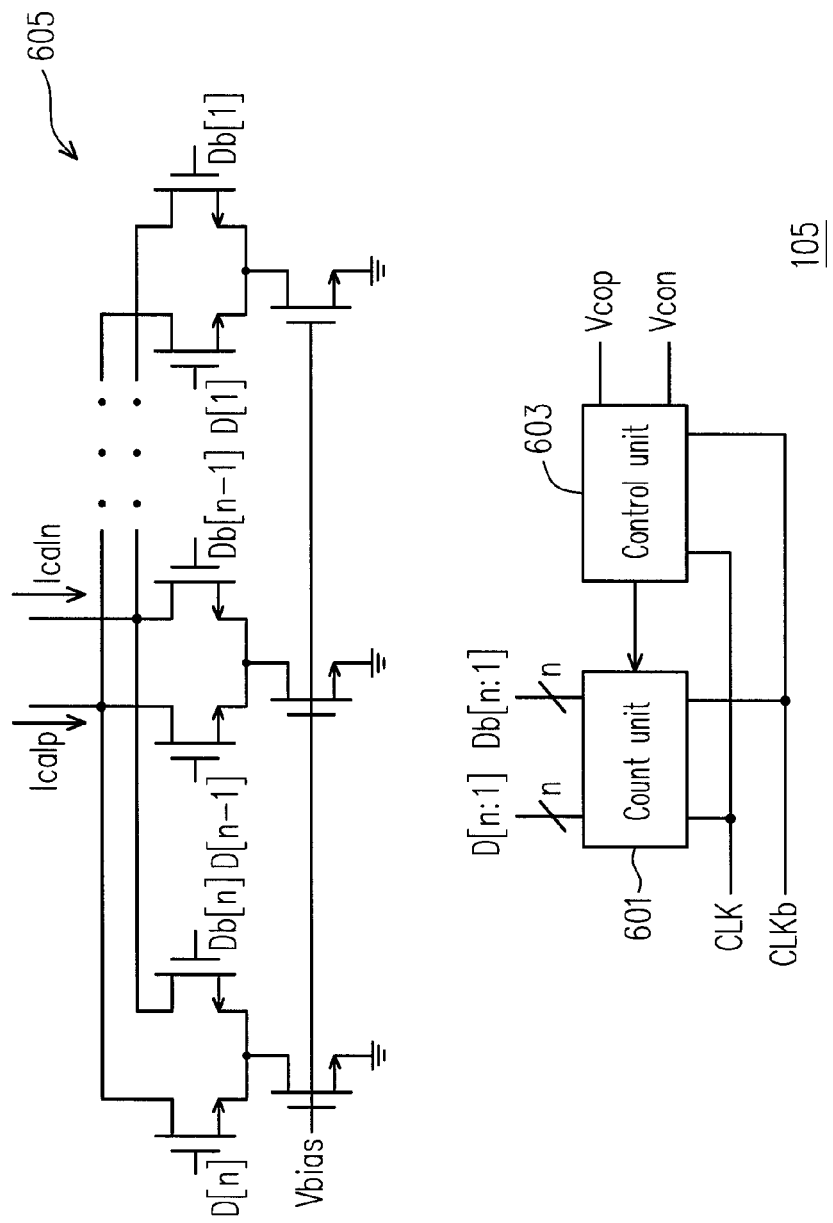

Moreover, in FIG. 6, the background offset calibration circuit 105 includes a count unit 601, a control unit 603 and a plurality of differential input pairs 605 operated under the bias Vbias. The control unit 603 controls the operation of the count unit 601 in response to the two reference switching control signals Vcop and Vcon generated by the asynchronous reset timing control circuit 107 and the first and the third basic clock signal (i.e. CLK and CLKb), so that the count unit 601 provides two set of digital control signals D[n:1] and Db[n:1]. In this way, a portion of the differential input pairs 605 may generate the two calibration currents Icalp and Icaln to the dynamic comparator 103 in response to the two set of digital control signals D[n:1] and Db[n:1].

In addition, the background offset calibration circuit 105 could also use a digital control signal mode to perform the background offset calibration to the dynamic comparator 103. Therefore, the two calibration signals K1 and K2 generated by the background offset calibration circuit 105 are two set of calibration digital control signals. In this case, the circuit structures of the dynamic comparator 103 are as that shown in FIG. 7A-FIG. 7C, and the circuit structure of the background offset calibration circuit 105 is as that shown in FIG. 8.

Figure 7A:
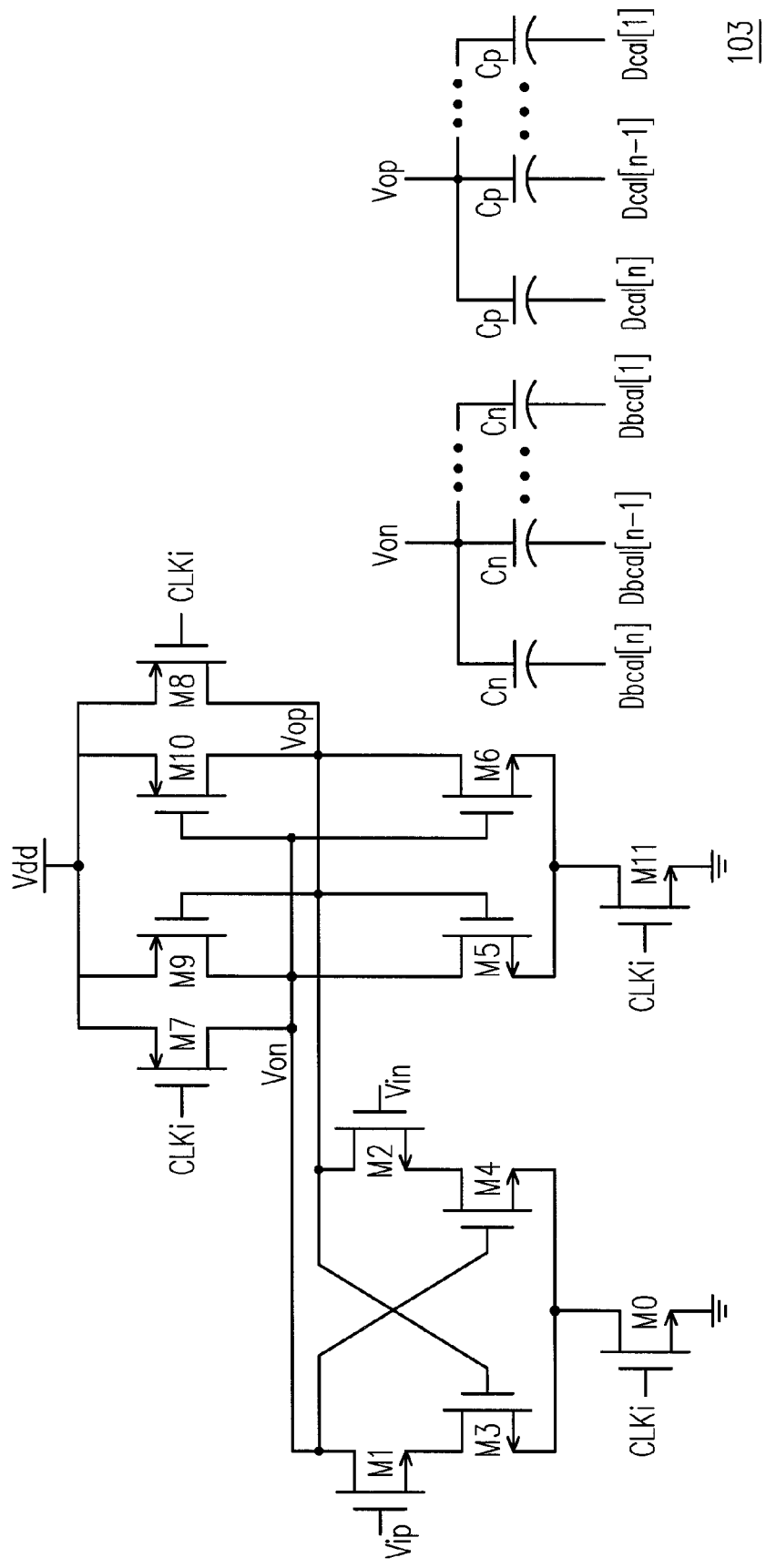
Figure 7B:
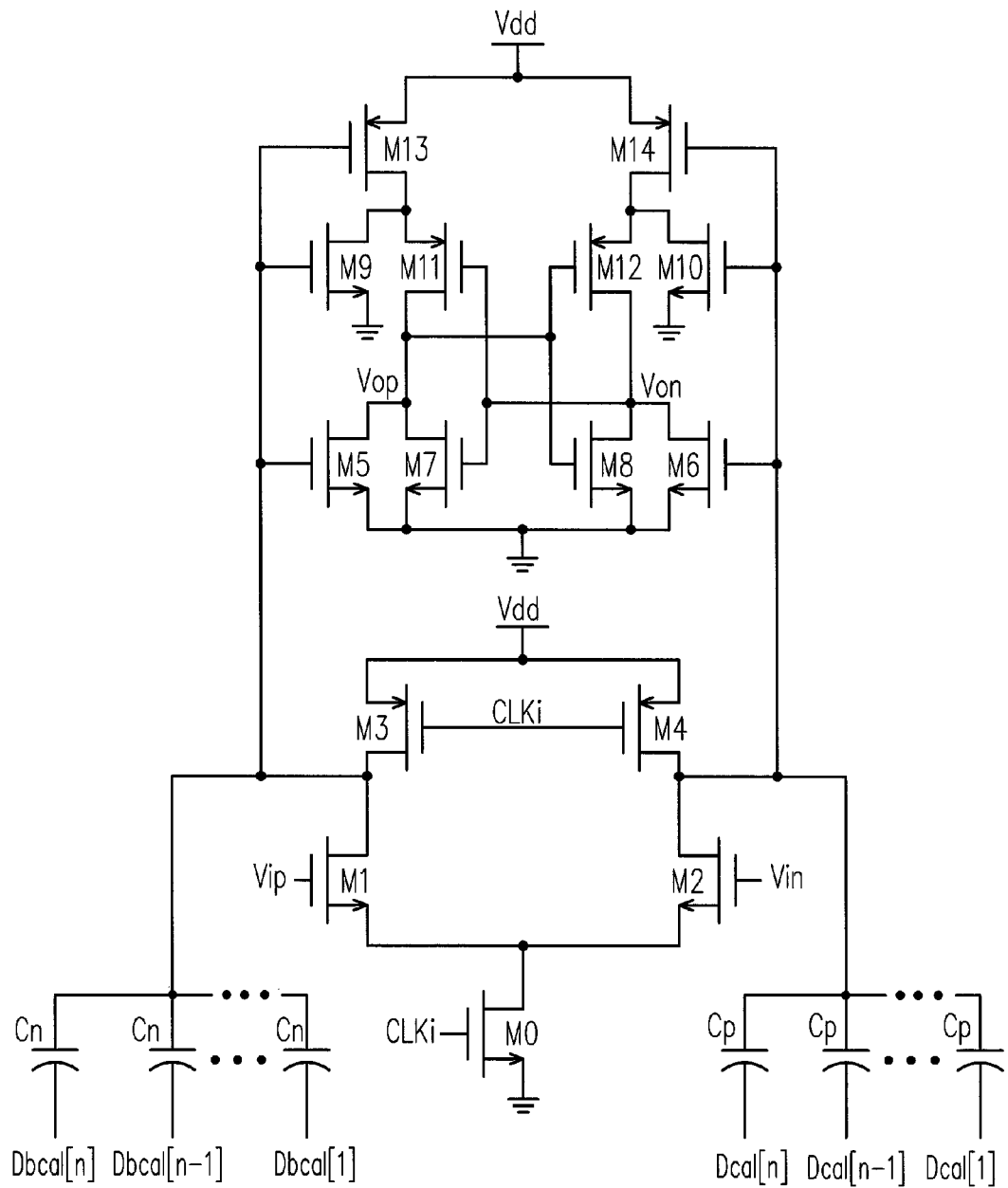
Figure 7C:
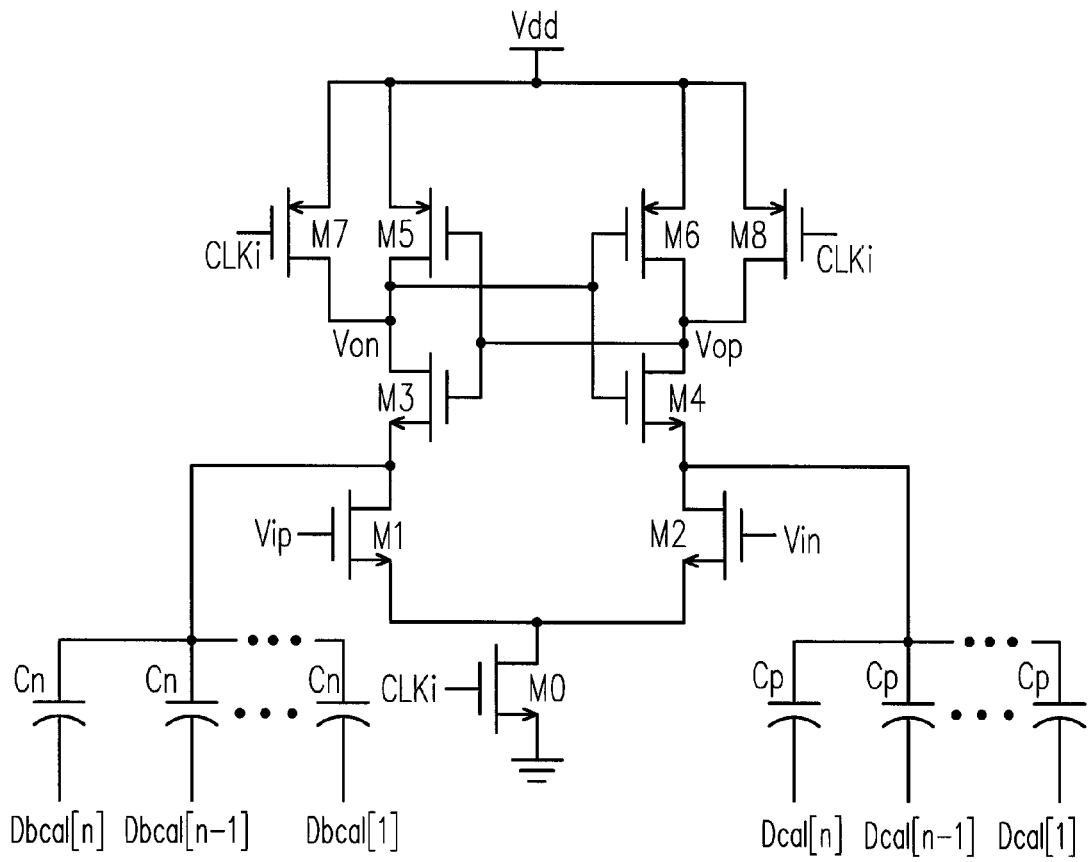

In FIG. 7A, the dynamic comparator 103 includes N-type transistors M0-M6 and M11, P-type transistors M7-M10, and a plurality of capacitors Cp and Cn. Moreover, in FIG. 7B, the dynamic comparator 103 includes N-type transistors M0-M2, M5-M10, P-type transistors M3, M4 and M11-M14, and a plurality of capacitors Cp and Cn. Furthermore, in FIG. 7C, the dynamic comparator 103 includes N-type transistors M0-M4, P-type transistors M5-M8, and a plurality of capacitors Cp and Cn. Gates of the N-type transistors M1 and M2 receive the differential input signal Vip and Vin from the input couple network 101, and one ends of the capacitors Cp and Cn receive two set of calibration digital control signals Dcal[n:1] and Dbcal[n:1] from the background offset calibration circuit 105. Basically, the dynamic comparators 103 of FIG. 7A-FIG. 7C operate in response to the control clock signal CLKi generated by the asynchronous reset timing control circuit 107.

Figure 8:
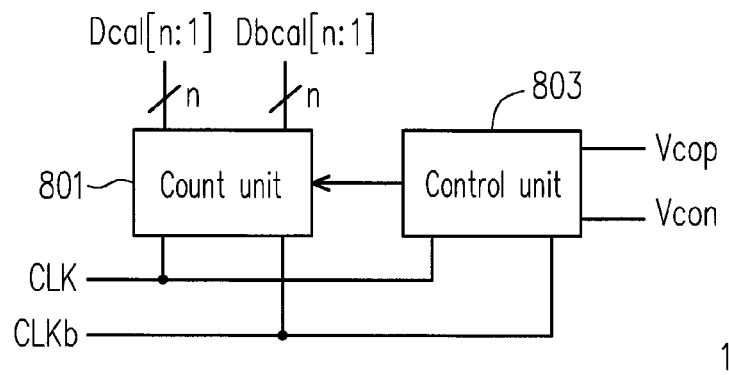

Moreover, in FIG. 8, the background offset calibration circuit 105 includes a count unit 801 and a control unit 803. The control unit 803 controls the operation of the count unit 801 in response to the two reference switching control signals Vcop and Vcon generated by the asynchronous reset timing control circuit 107 and the first and the third basic clock signal (i.e. CLK and CLKb), so that the count unit 801 provides the two set of calibration digital control signals Dcal[n:1] and Dbcal[n:1] to the dynamic comparator 103.

Herein, referring to FIG. 1, the asynchronous reset timing control circuit 107 is coupled to the dynamic comparator 103 and the background offset calibration circuit 105, and generates the control clock signal CLKi and the two reference switching control signals Vcop and Vcon in response to the output (i.e differential output signal Vop and Von, also named as (Vop−Von)) of the dynamic comparator 103 and a plurality of the basic clock signals CLK (the first basic clock signal), CLKb (the third basic clock signal), CLKe (the second basic clock signal) and CLKf (a fourth basic clock signal), and uses the control clock signal CLKi to control the dynamic comparator 103 to perform a comparison of the input refer offset and a comparison of the differential input signal Vip and Vin during each clock cycle Tclk of the first basic clock signal CLK (i.e. to perform two data comparison, one for the input refer offset and the other for a differential input signal), and uses the two reference switching control signals Vcop and Vcon to control the background offset calibration circuit 105 to generate the two calibration signals K1 and K2 to the dynamic comparator 103.

In the present exemplary embodiment, duty cycles of the first to the third basic clock signals CLK, CLKe and CLKb are the same, though the disclosure is not limited thereto; the first and the third basic clock signals CLK and CLKb have a phase difference (for example, 180 degrees, though the disclosure is not limited thereto); there is a delay time (Td) between the first and the second basic clock signals CLK and CLKe; and a duty cycle of the fourth basic clock signal CLKf is different to that of the first to the third basic clock signals CLK, CLKe, and CLKb, though the disclosure is not limited thereto. Under the above conditions, several circuit structures of the asynchronous reset timing control circuit 107 are provided below.

Figure 9A:
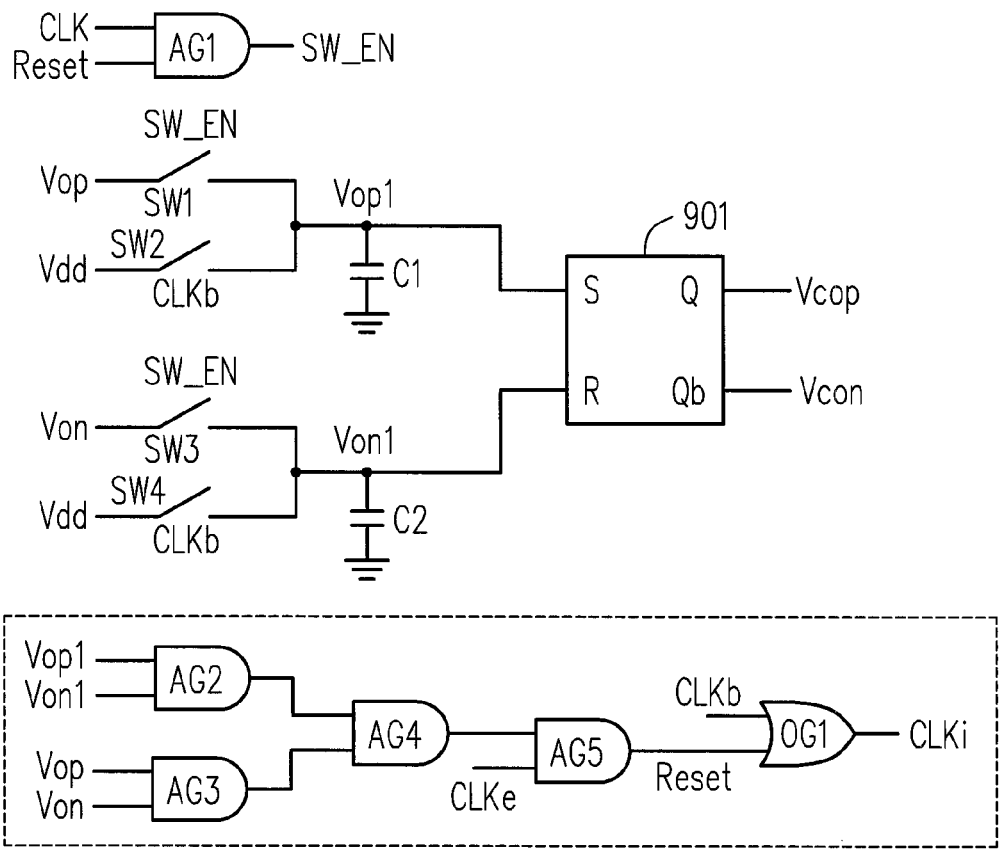
FIGS. 9A-9C are schematic diagrams respectively illustrating an asynchronous reset timing control circuit 107 according to an exemplary embodiment of the disclosure.

FIG. 9A is a schematic diagram of the asynchronous reset timing control circuit 107 according to an exemplary embodiment of the disclosure. Referring to FIG. 9A, the asynchronous reset timing control circuit 107 is designed in case that the dynamic comparator 103 is operated under a reset mode, and the differential output signal Vop and Von thereof has a high voltage level (Vdd). Therefore, the asynchronous reset timing control circuit 107 of FIG. 9A includes AND gates AG1-AG5, an OR gate OG1, switches SW1-SW4, capacitors C1 and C2, and an SR flip-flop 901.

A first input terminal of the AND gate AG1 receives the first basic clock signal CLK, a second input terminal of the AND gate AG1 receives a reset signal Reset, and an output terminal of the AND gate AG1 outputs a switching signal SW_EN. A first end of the switch SW1 receives the output signal Vop of the differential output signal Vop and Von, and a control terminal of the switch SW1 receives the switching signal SW_EN. A first end of the switch SW2 receives the high voltage level Vdd, and a control end of the switch SW2 receives the third basic clock signal CLKb.

A first end of the switch SW3 receives the output signal Von of the differential output signal Vop and Von, and a control terminal of the switch SW3 receives the switching signal SW_EN. A first end of the switch SW4 receives the high voltage level Vdd, and a control end of the switch SW4 receives the third basic clock signal CLKb. A first end of the capacitor C1 is coupled to second ends of the switches SW1 and SW2, and a second end of the capacitor C1 is coupled to a ground potential. A first end of the capacitor C2 is coupled to second ends of the switches SW3 and SW4, and a second end of the capacitor C2 is coupled to the ground potential. A set terminal (S) of the SR flip-flop 901 is coupled to the first end of the capacitor C1, a reset terminal (R) of the SR flip-flop 901 is coupled to the first end of the capacitor C2, and a first and a second output terminals (Q, Qb) of the SR flip-flop 901 output the two reference switching control signals Vcop and Vcon.

A first input terminal of the AND gate AG2 is coupled to the first end of the capacitor C1 (i.e. receives a voltage Vop1 on the first end of the capacitor C1), and a second input terminal of the AND gate AG2 is coupled to the first end of the capacitor C2 (i.e. receives a voltage Von1 on the first end of the capacitor C2). A first and a second input terminals of the AND gate AG3 receive the differential output signal Vop and Von. A first input terminal of the AND gate AG4 is coupled to an output terminal of the AND gate AG2, and a second input terminal of the AND gate AG4 is coupled to an output terminal of the AND gate AG3. A first input terminal of the AND gate AG5 is coupled to an output terminal of the AND gate AG4, a second input terminal of the AND gate AG5 receives the second basic clock signal CLKe, and an output terminal of the AND gate AG5 outputs the reset signal Reset. A first input terminal of the OR gate OG1 receives the third basic clock signal CLKb, a second input terminal of the OR gate OG1 is coupled to the output terminal of the AND gate AG5, and an output terminal of the OR gate OG1 outputs the control clock signal CLKi.

Figure 9B:
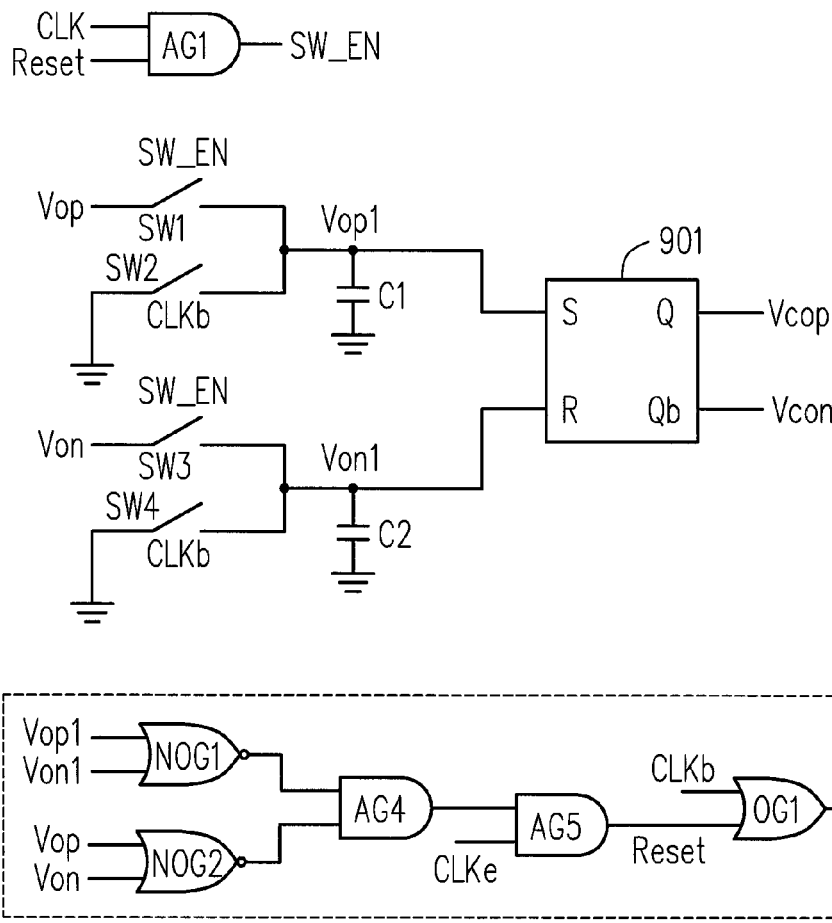

FIG. 9B is a schematic diagram of the asynchronous reset timing control circuit 107 according to another exemplary embodiment of the disclosure. Referring to FIG. 9A and FIG. 9B, the asynchronous reset timing control circuit 107 of FIG. 9B is designed in case that the dynamic comparator 103 is operated under the reset mode, and the differential output signal Vop and Von thereof has a ground potential (a low voltage level) (i.e. a complementary structure of the dynamic comparator 103 shown in FIGS. 3A-3B, FIGS. 5A-5C and FIGS. 7A-7C). In this case, the asynchronous reset timing control circuit 107 of FIG. 9B includes the AND gates AG1, AG4 and AG5, the OR gate OG1, NOR gates NOG1 and NOG2, the switches SW1-SW4, the capacitors C1 and C2, and the SR flip-flop 901. Differences between the exemplary embodiments of FIG. 9B and FIG. 9A are that in FIG. 9B, the NOR gates NOG1 and NOG2 are used to replace the AND gates AG2 and AG3 of FIG. 9A, and the first ends of the switches SW2 and SW4 are changed to be coupled to the ground potential.

Figure 9C:
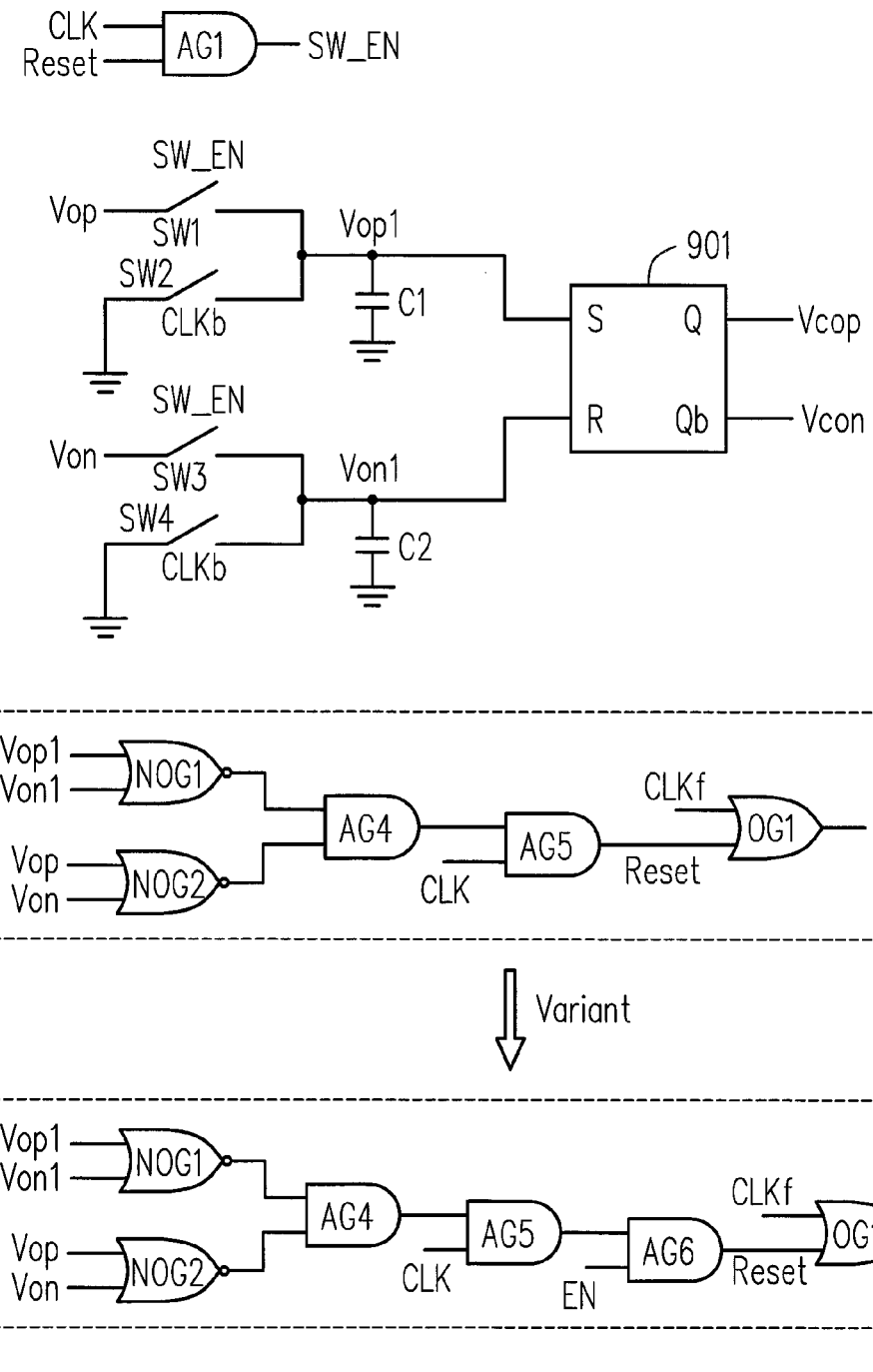

FIG. 9C is a schematic diagram of the asynchronous reset timing control circuit 107 according to still another exemplary embodiment of the disclosure. Referring to FIG. 9B and FIG. 9C, the asynchronous reset timing control circuit 107 of FIG. 9C is also designed in case that the dynamic comparator 103 is operated under the reset mode, and the differential output signal Vop and Von thereof has the ground potential (the low voltage level) (i.e. a complementary structure of the dynamic comparator 103 shown in FIGS. 3A-3B, FIGS. 5A-5C and FIGS. 7A-7C). In this case, the asynchronous reset timing control circuit 107 of FIG. 9C also includes the AND gates AG1, AG4 and AG5, the OR gate OG1, NOR gates NOG1 and NOG2, the switches SW1-SW4, the capacitors C1 and C2, and the SR flip-flop 901. Differences between the exemplary embodiments of FIG. 9C and FIG. 9B are that the second input terminal of the AND gate AG5 of FIG. 9C is changed to receive the first basic clock signal CLK, and the first input terminal of the OR gate OG1 of FIG. 9C is changed to receive the fourth basic clock signal CLKf.

Moreover, In FIG. 9C, an activation mechanism could be added in the logic circuit used of generating the control clock signal CLKi. In detail, the logic circuit used of generating the control clock signal CLKi that is marked as "variant" in FIG. 9C further includes an AND gate AG6. A first input terminal of the AND gate AG6 is coupled to the output terminal of the AND gate AG5, a second input terminal of the AND gate AG6 receives an enable signal EN, and an output terminal of the AND gate AG6 is coupled to the second input terminal of the OR gate OR1. In this way, when the enable signal EN is enabled, the background offset calibration circuit 105 is activated to perform the background offset calibration to the dynamic comparator 103. Comparatively, when the enable signal EN is disabled, the background offset calibration of the dynamic comparator 103 performed by the background offset calibration circuit 105 is disabled.

It could be known that the background offset calibration circuit 105 may determine whether or not to perform the background offset calibration to the dynamic comparator 103 in response to a state of the enable signal EN. In detail, when the enable signal EN is continually enabled, the background offset calibration circuit 105 performs the background offset calibration to the dynamic comparator 103, and when the enable signal EN is alternately enabled and disabled, the background offset calibration circuit 105 is changed to perform a foreground offset calibration to the dynamic comparator 103. In other words, by changing the state of the enable signal EN, the background offset calibration circuit 105 is changed to a foreground offset calibration circuit, and such variant implementation is also fall within the scope of the disclosure.

Figure 10A:
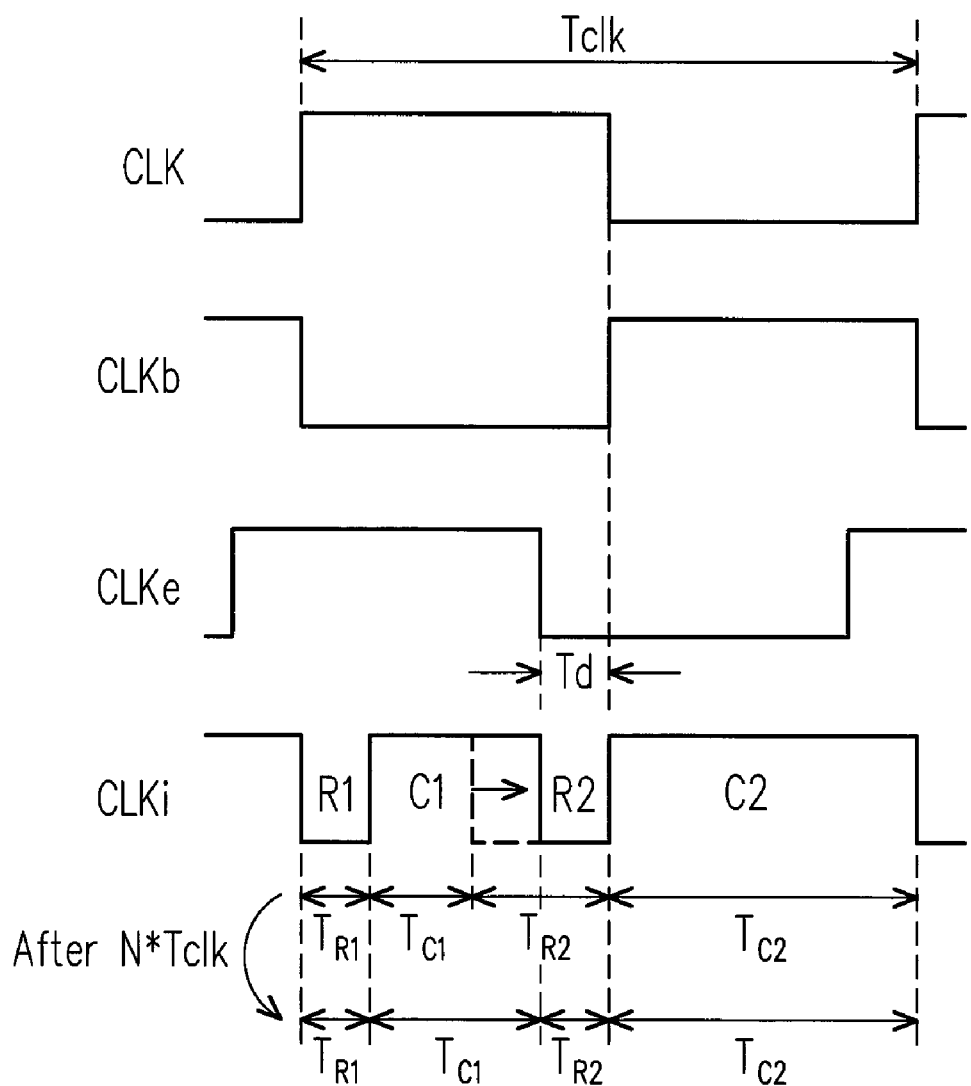
FIGS. 10A-10B are operation timing diagrams of an asynchronous reset timing control circuit 107 according to an exemplary embodiment of the disclosure.
Figure 10B:
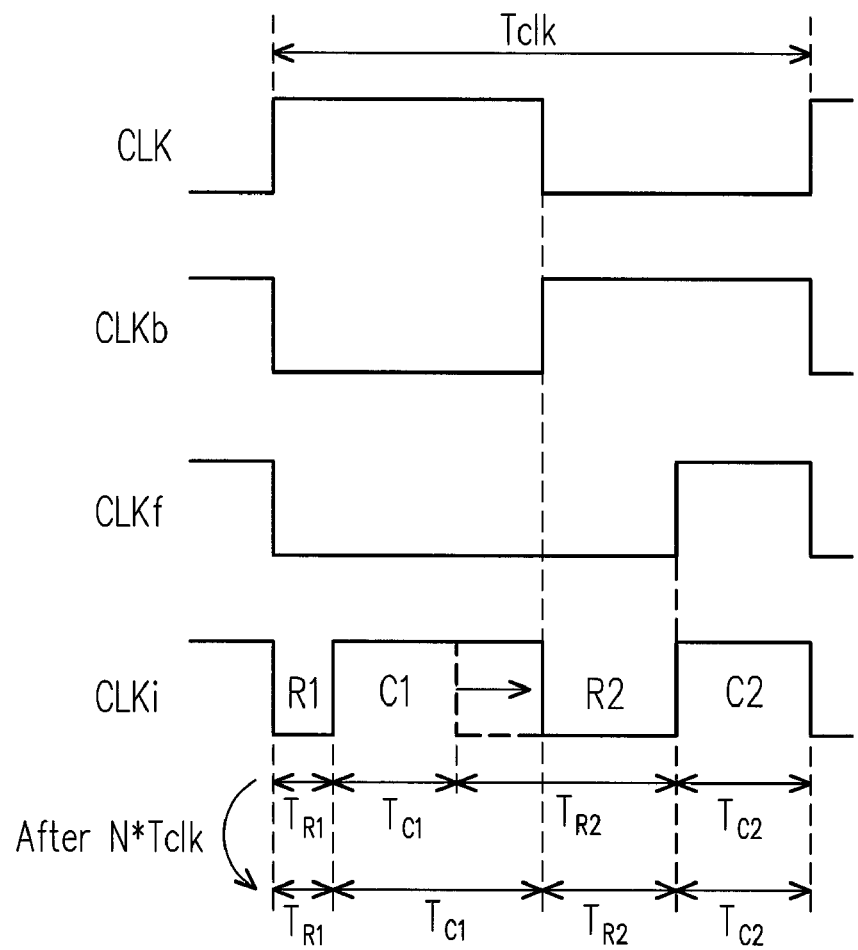

FIG. 10A is an operation timing diagram of the asynchronous reset timing control circuit 107 of FIG. 9A and FIG. 9B, and FIG. 10B is an operation timing diagram of the asynchronous reset timing control circuit 107 of FIG. 9C. Referring to FIG. 10A and FIG. 10B, it is obvious that the duty cycles of the first to the third basic clock signals CLK, CLKe and CLKb are the same (for example, 50%, though the disclosure is not limited thereto); the first and the third basic clock signals CLK and CLKb have a phase difference (for example, 180 degrees, though the disclosure is not limited thereto); there is a delay time (Td) between the first and the second basic clock signals CLK and CLKe; and a duty cycle of the fourth basic clock signal CLKf is different to that of the first to the third basic clock signals CLK, CLKe and CLKb (for example, 25%, though the disclosure is not limited thereto). However, regardless of any of the embodiments of FIGS. 9A-9C, the control clock signal CLKi generated by the asynchronous reset timing control circuit 107 has two enable phases C1 and C2 and two disable phases R1 and R2 corresponding to each clock cycle Tclk of the first basic clock signal CLK.

In the present exemplary embodiment, during the two enable phases C1 and C2, the dynamic comparator 103 enters a comparison mode to respectively perform the comparison of the input refer offset and the comparison of the differential input signal Vip and Vin. Moreover, during the two disable phases R1 and R2, the dynamic comparator 103 enters the reset mode to reset the output (i.e. the differential output signal Vop and Von) of the dynamic comparator 103. It should be noticed that a sum of time lengths $T_{C1}$ and $T_{C2}$ of the respective enable phases C1 and C2 and time lengths $T_{R1}$ and $T_{R2}$ of the respective disable phases R1 and R2 has to be equal to a time length of one clock cycle Tclk of the first basic clock signal CLK.

Furthermore, the time lengths of one of the two disable phases R1 and R2 (i.e. R2) and one of the two enable phases C1 and C2 (i.e. C1) are varied along with a difference degree among the two calibration signals K1 and K2 and the input refer offset. In detail, the greater the deference degree between a relative difference of the two calibration signals K1 and K2 (i.e. K1−K2) and the input refer offset is, the longer the time length $T_{R2}$ of the disable phase R2 is. Comparatively, the smaller the deference degree between the relative difference of the two calibration signals K1 and K2 (i.e. K1−K2) and the input refer offset is (i.e. a near convergent state after N clock cycles Tclk (marked as N*Tclk) of the first basic clock signal CLK), the shorter the time length $T_{R2}$ of the disable phase R2 is. However, regardless how the time length $T_{R2}$ of the disable period R2 is varied along with the difference degree among the two calibration signals K1 and K2 and the input refer offset, the sum of time lengths $T_{C1}$ and $T_{c2}$ of the respective enable phases C1 and C2 and the time lengths $T_{R1}$ and $T_{R2}$ of the respective disable phases R1 and R2 still has to be equal to the time length of one clock cycle Tclk of the first basic clock signal CLK. It is obvious that during each clock cycle Tclk of the first basic clock signal CLK, the time length of the disable phase R2 is not fixed, such that this is just a technical essence of the asynchronous reset timing control circuit 107.

In the present exemplary embodiment, during the disable phase R1, the output signals of the dynamic comparator 103 (i.e. the differential output signal Vop and Von) are reset to the high voltage level Vdd or the ground potential. Therefore, during the enable phase C1, the input couple network 101 can provide the common module voltage (i.e. Vip=Vin=Vcm) or a same input voltage Vip (i.e. Vip=Vin=Vinp) to the dynamic comparator 103. Meanwhile, the dynamic comparator 103 performs the comparison of the input refer offset, so as to output the differential output signal Vop and Von relating to the input refer offset.

In this way, the asynchronous reset timing control circuit 107 can generate the two reference switching control signals Vcop and Vcon to the background offset calibration circuit 105 in response to the current output of the dynamic comparator 103, so that the background offset calibration circuit 105 generates the two calibration signals K1 and K2 to calibrate the input refer offset of the dynamic comparator 103. In this case, assuming the deference degree between the relative difference of the two calibration signals K1 and K2 (i.e. K1−K2) generated at an initial stage and the input refer offset is substantially great, it may shorten the time length $T_{C1}$ of the enable phase C1 so that the time length $T_{R2}$ of the disable phase R2 is prolonged. Once the deference degree among the two generated calibration signals K1 and K2 and the input refer offset is decreased, that will cause the time length $T_{C1}$ of the enable phase C1 would be extended, so that the time length $T_{R2}$ of the disable phase R2 is shortened.

Thereafter, during the disable phase R2, the output signals of the dynamic comparator 103 (i.e. the differential output signal Vop and Von) are still reset to the high voltage level Vdd or the ground potential. Therefore, during the enable phase C2, the input couple network 101 can provide the differential input signal Vip and Vin to the dynamic comparator 103. Meanwhile, the dynamic comparator 103 performs the comparison of the differential input signal Vip and Vin, so as to output the differential output signal Vop and Von relating to the differential input signal Vip and Vin.

In summary, in the disclosure, the control clock signal used for controlling the dynamic comparator is suitably designed through a simple logic circuit (i.e. a complicated frequency synthesizer is not used), so that the single dynamic comparator can perform two signal comparison operations during each clock cycle (Tclk) of the first basic clock signal (CLK), where one is to perform the comparison of the offset of the dynamic comparator itself (i.e. the input refer offset), and another one is to perform the comparison of the differential input signal of the dynamic comparator. In this way, the single dynamic comparator can simultaneously complete the background offset calibration of the dynamic comparator and comparison of the differential input signal during each clock cycle of the first basic clock signal. Therefore, a usage amount of the dynamic comparators could be reduced to half, so that not only an area usage rate of the application of chip could be improved, but also system power consumption could be reduced.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A comparison system, comprising:
   a dynamic comparator;
   a background offset calibration circuit, coupled to the dynamic comparator, for generating two calibration signals to the dynamic comparator in response to two reference switching control signals, so as to calibrate an input refer offset of the dynamic comparator; and
   an asynchronous reset timing control circuit, coupled to the dynamic comparator and the background offset calibration circuit, for generating a control clock signal and the two reference switching control signals in response to an output of the dynamic comparator and a plurality of basic clock signals, and using the control clock signal to control the dynamic comparator to perform a comparison of the input refer offset and a comparison of a differential input signal during each clock cycle of a first basic clock signal of the basic clock signals.

2. The comparison system as claimed in claim 1, further comprising:
   an input couple network, coupled to the dynamic comparator, for providing a common mode voltage/a same input voltage or the differential input signal to the dynamic comparator in response to the first basic clock signal or a second basic clock signal of the basic clock signals.

3. The comparison system as claimed in claim 2, wherein the input couple network is an input alternating current (AC) couple network or an input direct current (DC) couple network.

4. The comparison system as claimed in claim 2, wherein the basic clock signals further comprise a third basic clock signal,
wherein duty cycles of the first to the third basic clock signals are the same, the first and the third basic clock signals have a phase difference, and a delay time exists between the first and the second basic clock signals.

5. The comparison system as claimed in claim 4, wherein the output of the dynamic comparator is a differential output signal, and the asynchronous reset timing control circuit comprises:
a first AND gate, having a first input terminal receiving the first basic clock signal, a second input terminal receiving a reset signal, and an output terminal outputting a switching signal;
a first switch, having a first end receiving a first output signal of the differential output signal, and a control end receiving the switching signal;
a second switch, having a first end receiving a high voltage level or a ground potential, and a control end receiving the third basic clock signal;
a third switch, having a first end receiving a second output signal of the differential output signal, and a control end receiving the switching signal;
a fourth switch, having a first end receiving the high voltage level or the ground potential, and a control end receiving the third basic clock signal;
a first capacitor, having a first end coupled to second ends of the first and the second switches, and a second end coupled to the ground potential;
a second capacitor, having a first end coupled to second ends of the third and the fourth switches, and a second end coupled to the ground potential; and
an SR flip-flop, having a set terminal coupled to the first end of the first capacitor, a reset terminal coupled to the first end of the second capacitor, and a first and a second output terminals outputting the two reference switching control signals.

6. The comparison system as claimed in claim 5, wherein the differential output signal is the high voltage level when the dynamic comparator is operated in a reset mode, the first ends of the second and the fourth switches receive the high voltage level, and the asynchronous reset timing control circuit further comprises:
a second AND gate, having a first input terminal coupled to the first end of the first capacitor, and a second input terminal coupled to the first end of the second capacitor;
a third AND gate, having a first and a second input terminals receiving the differential output signal;
a fourth AND gate, having a first input terminal coupled to an output terminal of the second AND gate, and a second input terminal coupled to an output terminal of the third AND gate;
a fifth AND gate, having a first input terminal coupled to an output terminal of the fourth AND gate, a second input terminal receiving the second basic clock signal, and an output terminal outputting the reset signal; and
an OR gate, having a first input terminal receiving the third basic clock signal, a second input terminal coupled to the output terminal of the fifth AND gate, and an output terminal outputting the control clock signal.

7. The comparison system as claimed in claim 5, wherein the differential output signal is the ground potential when the dynamic comparator is operated in a reset mode, the first ends of the second and the fourth switches receive the ground potential, and the asynchronous reset timing control circuit further comprises:
a first NOR gate, having a first input terminal coupled to the first end of the first capacitor, and a second input terminal coupled to the first end of the second capacitor;
a second NOR gate, having a first and a second input terminals receiving the differential output signal;
a second AND gate, having a first input terminal coupled to an output terminal of the first NOR gate, and a second input terminal coupled to an output terminal of the second NOR gate;
a third AND gate, having a first input terminal coupled to an output terminal of the second AND gate, a second input terminal receiving the second basic clock signal, and an output terminal outputting the reset signal; and
an OR gate, having a first input terminal receiving the third basic clock signal, a second input terminal coupled to the output terminal of the third AND gate, and an output terminal outputting the control clock signal.

8. The comparison system as claimed in claim 5, wherein the basic clock signals further comprise a fourth basic clock signal,
wherein a duty cycle of the fourth basic clock signal is different to that of the first to the third basic clock signals.

9. The comparison system as claimed in claim 8, wherein the differential output signal is the ground potential when the dynamic comparator is operated in a reset mode, the first ends of the second and the fourth switches receive the ground potential, and the asynchronous reset timing control circuit further comprises:
a first NOR gate, having a first input terminal coupled to the first end of the first capacitor, and a second input terminal coupled to the first end of the second capacitor;
a second NOR gate, having a first and a second input terminals receiving the differential output signal;
a second AND gate, having a first input terminal coupled to an output terminal of the first NOR gate, and a second input terminal coupled to an output terminal of the second NOR gate;
a third AND gate, having a first input terminal coupled to an output terminal of the second AND gate, a second input terminal receiving the first basic clock signal, and an output terminal outputting the reset signal; and
an OR gate, having a first input terminal receiving the fourth basic clock signal, a second input terminal coupled to the output terminal of the third AND gate, and an output terminal outputting the control clock signal.

10. The comparison system as claimed in claim 9, wherein the asynchronous reset timing control circuit further comprises:
a fourth AND gate, having a first input terminal coupled to the output terminal of the third AND gate, a second input terminal receiving an enable signal, and an output terminal coupled to the second input terminal of the OR gate,
wherein the background offset calibration circuit determines whether or not to perform a background offset calibration to the dynamic comparator in response to a state of the enable signal,
when the enable signal is continually enabled, the background offset calibration circuit performs the background offset calibration to the dynamic comparator; and when the enable signal is alternately enabled and disabled, the background offset calibration circuit is changed to perform a foreground offset calibration to the dynamic comparator.

11. The comparison system as claimed in claim 1, wherein the control clock signal has two enable phases and two disable phases corresponding to each clock cycle of the first basic clock signal, wherein during the two enable phases, the dynamic comparator enters a comparison mode to respectively perform the comparison of the input refer offset and the comparison of the differential input signal;

during the two disable phases, the dynamic comparator enters a reset mode to reset the output of the dynamic comparator; and time lengths of one of the two disable phases and one of the two enable phases are varied along with a difference degree among the two calibration signals and the input refer offset.

12. The comparison system as claimed in claim 1, wherein the background offset calibration circuit applies a voltage mode to perform a background offset calibration to the dynamic comparator.

13. The comparison system as claimed in claim 12, wherein the two calibration signals are two calibration voltages.

14. The comparison system as claimed in claim 1, wherein the background offset calibration circuit applies a current mode to perform a background offset calibration to the dynamic comparator.

15. The comparison system as claimed in claim 14, wherein the two calibration signals are two calibration currents.

16. The comparison system as claimed in claim 1, wherein the background offset calibration circuit applies a digital control signal mode to perform a background offset calibration to the dynamic comparator.

17. The comparison system as claimed in claim 16, wherein the two calibration signals are two set of calibration digital control signals.

\* \* \* \* \*